United States Patent
Ehara

(10) Patent No.: US 9,236,845 B2
(45) Date of Patent: Jan. 12, 2016

(54) CERAMIC MULTILAYER COMPONENT

(71) Applicant: Murata Manufacturing Co., Ltd., Nagaokakyo-shi, Kyoto-fu (JP)

(72) Inventor: Akihiro Ehara, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 58 days.

(21) Appl. No.: 14/083,514

(22) Filed: Nov. 19, 2013

(65) Prior Publication Data
US 2014/0203892 A1 Jul. 24, 2014

(30) Foreign Application Priority Data

Jan. 24, 2013 (JP) ................................. 2013-010730

(51) Int. Cl.
| H03H 7/01 | (2006.01) |
| H01G 4/12 | (2006.01) |
| H01G 4/30 | (2006.01) |
| H01F 17/00 | (2006.01) |
| H01G 4/005 | (2006.01) |
| H01G 4/228 | (2006.01) |
| H03H 1/00 | (2006.01) |

(52) U.S. Cl.
CPC ............ *H03H 7/0115* (2013.01); *H01F 17/00* (2013.01); *H01G 4/005* (2013.01); *H01G 4/12* (2013.01); *H01G 4/228* (2013.01); *H01G 4/30* (2013.01); *H03H 2001/0085* (2013.01)

(58) Field of Classification Search
CPC ............ H03H 2001/0014; H03H 2001/0085; H03H 7/0115; H01G 4/03; H01G 4/005; H01G 4/228; H01G 4/12; H01F 17/00
USPC ................................................... 333/185, 175
See application file for complete search history.

(56) References Cited

U.S. PATENT DOCUMENTS

| 6,759,926 B2* | 7/2004 | Yamaguchi .................... 333/175 |
| 2002/0011659 A1 | 1/2002 | Nishide et al. |
| 2006/0022770 A1* | 2/2006 | Asakawa ....................... 333/175 |
| 2007/0296520 A1* | 12/2007 | Hosokawa et al. ........... 333/132 |

(Continued)

FOREIGN PATENT DOCUMENTS

| JP | 11-251723 A | 9/1999 |
| JP | 2001-316169 A | 11/2001 |

(Continued)

OTHER PUBLICATIONS

Official Communication issued in corresponding Taiwanese Patent Application No. 102135655, mailed on Nov. 18, 2014.

(Continued)

*Primary Examiner* — Benny Lee
*Assistant Examiner* — Rakesh Patel
(74) *Attorney, Agent, or Firm* — Keating & Bennett, LLP

(57) ABSTRACT

A ceramic multilayer component includes a ceramic body including a plurality of ceramic layers stacked on top of one another, internal electrodes located inside the ceramic multilayer body, terminal electrodes located on a mounting surface of the ceramic multilayer body, and via hole conductors that are arranged inside the ceramic multilayer body so as to connect the internal electrodes and the terminal electrodes to each other. An insulating portion is arranged to extend as a single body across a surface of the ceramic multilayer body and across the terminal electrodes. The insulating portion covers at least a portion of each of the via conductors and covers a portion of each of the terminal electrodes when viewed from the mounting surface side.

16 Claims, 3 Drawing Sheets

(56) References Cited

U.S. PATENT DOCUMENTS

| | | | |
|---|---|---|---|
| 2009/0243756 A1* | 10/2009 | Stevenson | H01G 4/40 333/172 |
| 2010/0020465 A1 | 1/2010 | Fukudome | |
| 2014/0326492 A1 | 11/2014 | Miyahara et al. | |

FOREIGN PATENT DOCUMENTS

| | | |
|---|---|---|
| JP | 2005-209881 A | 8/2005 |
| JP | 2007-059533 A | 3/2007 |
| JP | 4277275 B2 | 6/2009 |
| JP | 2010-27899 A | 2/2010 |
| TW | 201042680 A1 | 12/2010 |

OTHER PUBLICATIONS

Official Communication issued in corresponding Japanese Patent Application No. 2013-010730, mailed on Nov. 25, 2014.

* cited by examiner

CERAMIC MULTILAYER COMPONENT

BACKGROUND OF THE INVENTION

1. Field of the Invention

The present invention relates to ceramic multilayer components that are provided on a mounting surface thereof with terminal electrodes that are connected to internal electrodes through via hole conductors.

2. Description of the Related Art

To date, ceramic multilayer components such as that disclosed in Japanese Unexamined Patent Application Publication No. 2007-59533 have been used in electronic circuits of cellular phones and so forth.

A mounting surface of a ceramic multilayer component 300 disclosed in Japanese Unexamined Patent Application Publication No. 2007-59533 is illustrated in FIG. 3.

The ceramic multilayer component 300 includes a ceramic multilayer body 110 inside of which circuit patterns (not illustrated) that function as inductor elements, capacitor elements and so forth are formed.

A plurality of terminal electrodes 104a are provided in the center of a mounting surface of the ceramic multilayer body 110 and a plurality of terminal electrodes 104b are provided around the periphery of the mounting surface of the ceramic multilayer body 110.

The plurality of terminal electrodes 104a, which are formed in the center of the mounting surface, are connected to circuit patterns formed inside the ceramic multilayer body 110 through via hole conductors 103 formed directly below the terminal electrodes 104a.

A high degree of flatness is demanded for the mounting surface of the thus-structured ceramic multilayer component 300 in order to realize good mountability, a property of good contact with terminals for measurement of characteristics, good transportability and so forth.

However, sometimes a material having a percentage of shrinkage at the time of firing that is smaller than that of the ceramic multilayer body 110 is used as the material of the via hole conductors 103 in the above-described ceramic multilayer component 300 of the related art. In such a case, sometimes the via hole conductors 103 formed directly below the terminal electrodes 104a protrude out from the surrounding ceramic multilayer body 110 upon being subjected to firing and a sufficient degree of flatness is not obtained for the mounting surface.

In particular, the degree of protruding of the via hole conductors 103 caused by firing becomes larger and the insufficient degree of flatness of the mounting surface becomes more noticeable in the case where the distance between adjacent via hole conductors 103 has been made smaller in order to, for example, decrease the size of the ceramic multilayer component 300.

SUMMARY OF THE INVENTION

Accordingly, preferred embodiments of the present invention provide a ceramic multilayer component including a mounting surface with a high degree of flatness due to protruding of via hole conductors being prevented or significantly reduced.

A ceramic multilayer component according to a preferred embodiment of the present invention includes a ceramic multilayer body including a plurality of ceramic layers stacked on top of one another, an internal electrode located inside the ceramic multilayer body, a terminal electrode located on a mounting surface of the ceramic multilayer body, and a via hole conductor that is arranged inside the ceramic multilayer body so as to connect the internal electrode and the terminal electrode to each other. An insulating portion is arranged to extend as a single body across a surface of the ceramic multilayer body and across a surface of the terminal electrode. The insulating portion covers at least a portion of the via hole conductor and covers a portion of the terminal electrode when viewed from the mounting surface side.

According to various preferred embodiments of the present invention, a ceramic multilayer component including a mounting surface with a high degree of flatness as a result of preventing protruding of via hole conductors is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1A:
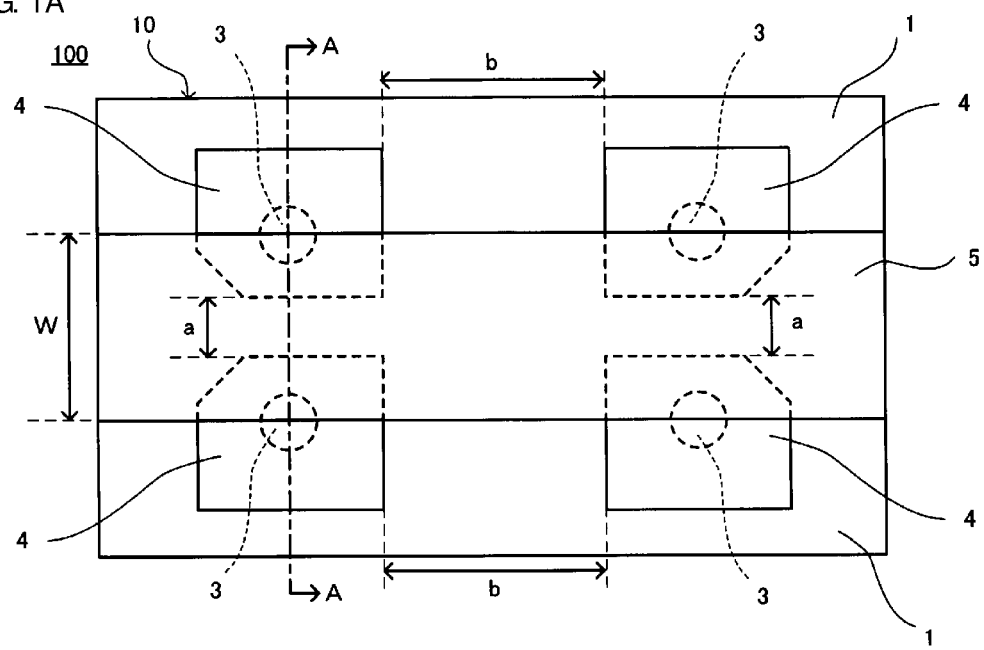
FIG. 1A is a plan view illustrating a mounting surface of a ceramic multilayer component according to a first preferred embodiment of the present invention.
Figure 1B:
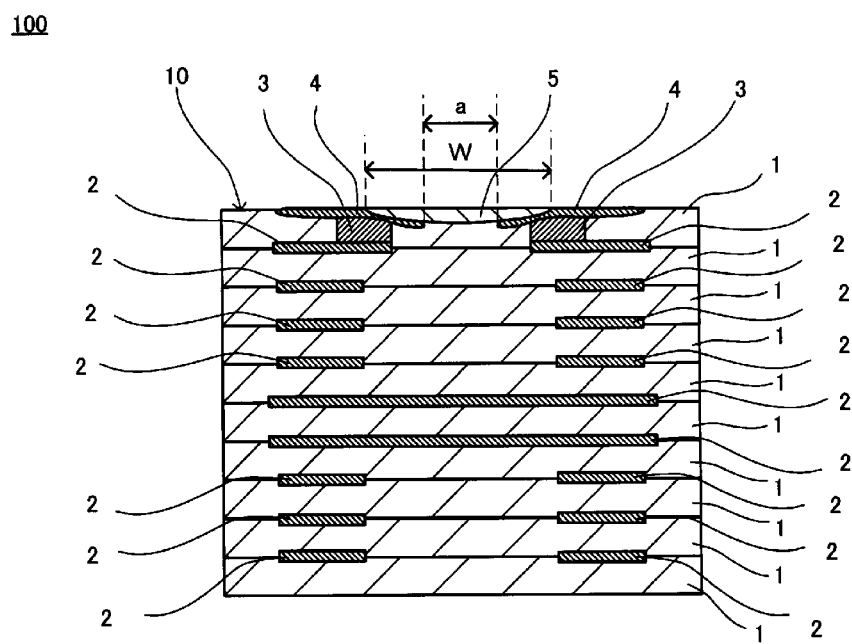
FIG. 1B is a sectional view of the ceramic multilayer component taken along line A-A.

A mounting surface of a ceramic multilayer component 100 according to a first preferred embodiment of the present invention is illustrated in FIG. 1A. A sectional view of the ceramic multilayer component 100 of FIG. 1A taken along line A-A is illustrated in FIG. 1B. The ceramic multilayer component 100 is a chip component that functions as an LC filter preferably used in, for example, a high-frequency circuit.

The ceramic multilayer component 100 includes a ceramic multilayer body 10 that is rectangular or substantially rectangular parallelepiped shaped and includes a plurality of ceramic layers 1 stacked on top of one another. The ceramic multilayer body 10 preferably has a size of, for example, about 0.6 mm in length, about 0.5 mm in width and about 0.5 mm in thickness. The ceramic multilayer body 10 is preferably composed of, for example, a BaO—$Al_2O_3$—$SiO_2$-based low-temperature-sintered ceramic material (hereafter, referred to as a BAS material).

A plurality of internal electrodes 2 preferably composed of Cu are formed, as illustrated in FIG. 1B, at boundary surfaces between the plurality of stacked ceramic layers 1. The plurality of internal electrodes 2 are connected to one another through via hole conductors (not illustrated) located inside the ceramic layers 1. The plurality of internal electrodes 2 connected to one another through the via hole conductors together function as an LC circuit.

A total of four terminal electrodes 4 preferably composed of Cu are provided, for example, one being located in the vicinity of each of the four corners of the rectangular or substantially rectangular mounting surface of the ceramic multilayer body 10. The shape of the terminal electrodes 4 is pentagonal or substantially pentagonal when viewed from the mounting surface side, this shape being obtained by cutting off one corner of a rectangular or substantially rectangular shape. Each of the four terminal electrodes 4 includes two adjacent terminal electrodes 4, one at a distance a therefrom, which is a shortest distance, and the other at a distance b (>a) therefrom, which is a longest distance. The four terminal electrodes 4 are each connected to an internal electrode 2 through a via hole conductor 3 located inside the ceramic multilayer body 10.

A rectangular or substantially rectangular insulating portion 5 extends from one short side of the substantially rectangular mounting surface of the ceramic multilayer body 10 to the other opposing short side. The length of the short sides of the rectangular or substantially rectangular insulating portion 5 is W (>a). The insulating portion 5 is arranged so as to extend as a single body across an area between terminal electrodes 4 that are adjacent to each other with the distance a therebetween and across opposing portions of the terminal electrodes 4. In addition, when the insulating portion 5 is viewed from the mounting surface side of the ceramic multilayer body 10, the insulating portion 5 disposed on the surfaces of the terminal electrodes 4 covers a portion of each of the via hole conductors 3 located directly below the terminal electrodes 4.

The insulating portion 5 is preferably composed of, for example, a BAS material, which is a ceramic-based material. Since the insulating portion 5 is preferably composed of the same ceramic-based material as the ceramic multilayer body 10, the insulating portion 5 is strongly fixed to the mounting surface of the ceramic multilayer body 10, that is, the mounting surface of the ceramic multilayer component 100.

A sufficient degree of flatness is obtained for the mounting surface of the ceramic multilayer component 100, as illustrated in FIG. 1B. Consequently, good mountability, a property of good contact with terminals for measurement of characteristics, good transportability and so forth are realized.

In addition, as illustrated in FIGS. 1A and 1B, due to the fact that the rectangular or substantially rectangular insulating portion 5 including short sides of length W covers opposing portions of each set of two terminal electrodes 4 adjacent to each other with the distance a therebetween, the distance between exposed surfaces of the two terminal electrodes 4 is W. Since the distance W between exposed surfaces of the terminal electrodes 4, which are adjacent to each other with the distance a therebetween, can be made as large as desired using the width W (>a) of the insulating portion 5, shorts between the terminal electrodes 4 are prevented and the distance between exposed surfaces of the terminal electrodes 4 that fit the electrode patterns of the mounting substrate is easily controlled.

Next, an example of a method of manufacturing the thus-structured ceramic multilayer component 100 will be described.

First, a plurality of ceramic green sheets (corresponding to the above-described ceramic layers 1) are formed using a slurry containing a BAS material, an organic solvent, a binder, a plasticizer and so forth using a doctor blade method.

Then, via holes are formed in portions of the plurality of green sheets using punching or laser irradiation.

Then, the via holes formed in the ceramic green sheets are filled with Cu paste by printing, such that the via hole conductors 3 are formed.

Then, the internal electrodes 2 and the terminal electrodes 4 are formed by pattern printing Cu paste onto portions of the plurality of ceramic green sheets.

Then, the insulating portion 5 is formed so as to extend as a single body across the surface of the ceramic green sheet on which the terminal electrodes 4 have been formed and across portions of the surfaces of the terminal electrodes 4 by pattern printing a BAS material. The insulating portion 5 formed on the surfaces of the terminal electrodes 4 is formed so as to cover portions of the upper sides of the via hole conductors 3 formed directly below the terminal electrodes 4.

Then, the plurality of ceramic green sheets formed in the above-described processes are stacked in the order illustrated in FIG. 1B, which is a view of the completed ceramic multilayer component 100, and subjected to pressing, such that the ceramic multilayer body 10 composed of the plurality of ceramic layers 1 is formed. Through the pressing, the mounting surface of the ceramic multilayer body 10 is made flat.

Finally, the ceramic multilayer body 10 is fired, such that the ceramic multilayer component 100 illustrated in FIGS. 1A and 1B is completed.

The percentage of shrinkage of the Cu paste used in the via hole conductors 3 at the time of firing is generally smaller than that of the BAS material used in the ceramic multilayer body 10. Consequently, when the ceramic multilayer body 10 is fired, the via hole conductors 3 formed directly under the terminal electrodes 4 attempt to protrude from the surrounding ceramic multilayer body 10. However, protruding of the via hole conductors 3 is prevented because the insulating portion 5, which is strongly fixed to the mounting surface of the ceramic multilayer body 10 is arranged so as to form a wall on the upper side of the via hole conductors 3. Consequently, even after firing, a sufficient degree of flatness is obtained for the mounting surface.

Second Preferred Embodiment

Figure 2:
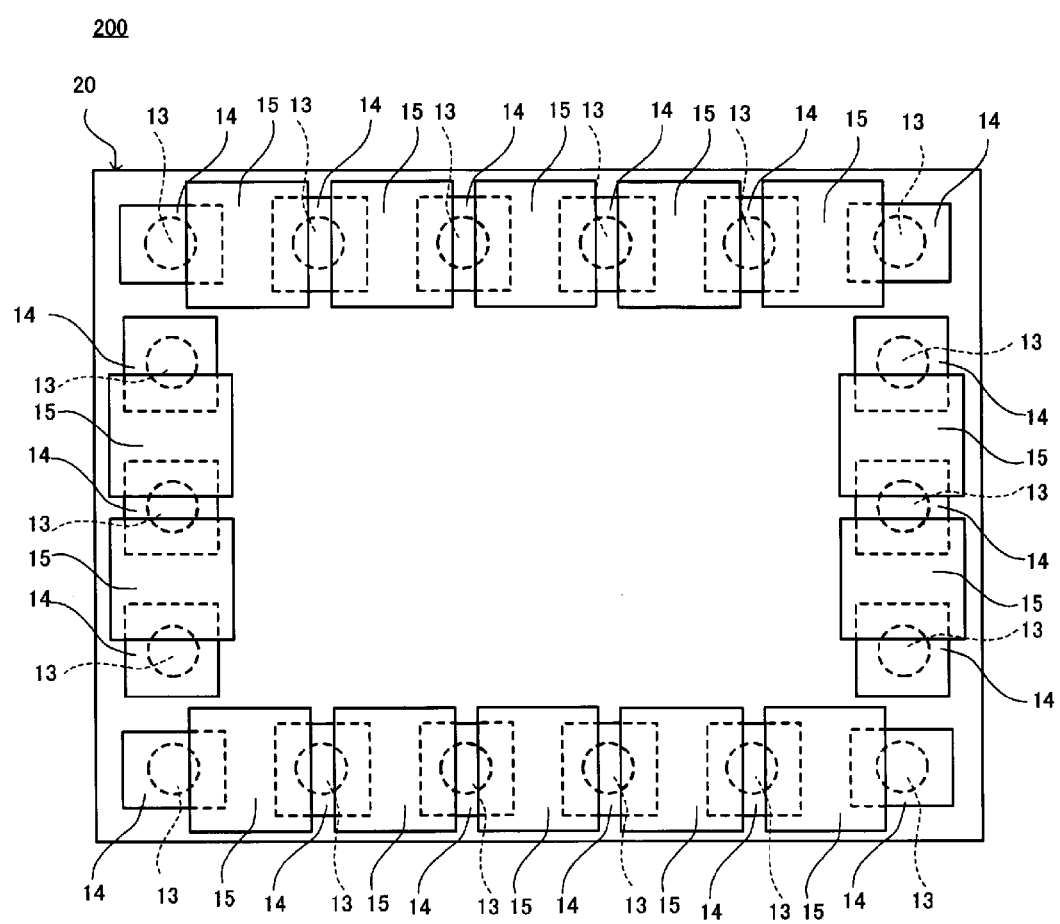
FIG. 2 is a plan view illustrating a mounting surface of a ceramic multilayer component according to a second preferred embodiment of the present invention.
Figure 3:
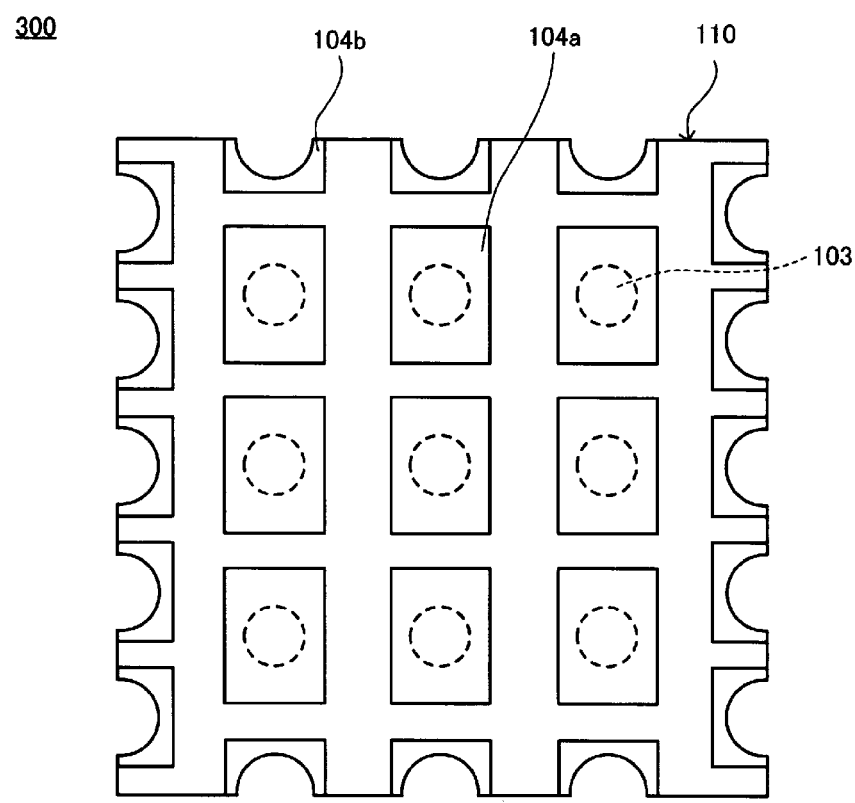
FIG. 3 is a plan view illustrating a mounting surface of a ceramic multilayer component of the related art.

A mounting surface of a ceramic multilayer component 200 according to a second preferred embodiment of the present invention is illustrated in FIG. 2. The ceramic multilayer component 100 according to the first preferred embodiment preferably is a chip component, whereas the ceramic multilayer component 200 according to the second preferred embodiment is a module component that includes semiconductor elements, resistance elements and so forth (not illustrated) mounted on a surface thereof.

The ceramic multilayer component 200 includes a ceramic multilayer body 20 including a plurality of ceramic layers (not illustrated) stacked on top of one another.

Internal electrodes (not illustrated) are provided at boundary surfaces between the plurality of ceramic layers.

A large number of terminal electrodes 14 are provided next to one another around the periphery of the mounting surface of the ceramic multilayer body 20.

Via hole conductors 13, which are connected to the internal electrodes, are located directly below the terminal electrodes 14.

An insulating portion 15 is arranged so as to extend as a single body across the surfaces of each two adjacent terminal electrodes 14 and across the area of the mounting surface of the ceramic multilayer body 20 between the two terminal electrodes 14. When viewed from the mounting surface side, the insulating portions 15 provided on the surfaces of the terminal electrodes 14 cover portions of the via hole conductors 13 located directly below the terminal electrodes 14.

Thus, the ceramic multilayer component of a preferred embodiment of the present invention can also be applied to a circuit module having a large number of terminal electrodes. A sufficient degree of flatness can also be obtained for the mounting surface in this case as a result of protruding of the via hole conductors 13 that occurs at the time of firing being prevented by the insulating portions 15.

Examples of the structures of the ceramic multilayer components 100 and 200 according to the first and second preferred embodiments of the present invention and an example of a manufacturing method therefor have been described above. However, a ceramic multilayer component and a manufacturing method therefor according to preferred embodiments of the present invention are not limited to the above-described content, and various modifications can be made within the gist of the present invention.

For example, in the preferred embodiments, the insulating portions 5 and 15 are preferably arranged so as to cover portions of the via hole conductors 3 and 13 when viewed from the mounting surface side, but insulating portions may be arranged so as to cover the entirety of each of the via hole conductors. In the case where the entirety of each of the via hole conductors are covered, protruding of the via hole conductors are more effectively prevented since the area over which the via hole conductors are covered by the insulating portions is larger.

In addition, in the preferred embodiments, the insulating portions 5 and 15 are arranged such that one insulating portion extends across a plurality of adjacent terminal electrodes 4 and 14, but the insulating portions may instead be arranged such that one insulating portion extends across only a single terminal electrode.

In addition, in the preferred embodiments, a BAS material is preferably used as the material of the insulating portions 5 and 15, for example, but glass or the like may be used instead. Protruding of the via hole conductors is also significantly reduced or prevented in the case where glass or the like is used as the material of the insulating portions 5 and 15.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic multilayer component, comprising:
    a ceramic multilayer body including a plurality of ceramic layers stacked on top of one another;
    an internal electrode located inside the ceramic multilayer body;
    a terminal electrode located on a mounting surface of the ceramic multilayer body; and
    a via hole conductor arranged inside the ceramic multilayer body so as to connect the internal electrode and the terminal electrode to each other; wherein a surface of the ceramic multilayer body includes a first edge and an opposite second edge;
    an insulating portion is arranged to extend as a single body across the surface of the ceramic multilayer body from the first edge to the opposite second edge and across a surface of the terminal electrode;
    the insulating portion covers at least a portion of the via hole conductor and covers a portion of the terminal electrode when viewed from a side of the mounting surface;
    the insulating portion has a surface area less than a surface area of each of the plurality of ceramic layers; and
    the insulating portion is arranged to cover only a portion of an uppermost ceramic layer of the plurality of ceramic layers while not covering another portion of the uppermost ceramic layer when viewed from the side of the mounting surface.

2. The ceramic multilayer component according to claim 1, wherein the insulating portion is arranged to cover an entirety of the via hole conductor.

3. The ceramic multilayer component according to claim 1, wherein
    the terminal electrode includes a plurality of terminal electrodes, the plurality of terminal electrodes being adjacent to one another; and
    the insulating portion is arranged to extend as a single body across respective surfaces of the plurality of adjacent terminal electrodes.

4. The ceramic multilayer component according to claim 3, wherein the insulating portion is arranged on a pair of adjacent terminal electrodes of the plurality of adjacent terminal electrodes having a minimum distance therebetween among other pairs of the plurality of adjacent terminal electrodes.

5. The ceramic multilayer component according to claim 1, wherein the ceramic multilayer component is a chip component.

6. The ceramic multilayer component according to claim 1, wherein the ceramic multilayer component is an LC filter.

7. The ceramic multilayer component according to claim 1, wherein the ceramic multilayer body is rectangular or substantially rectangular parallelepiped shaped.

8. The ceramic multilayer component according to claim 1, wherein the ceramic multilayer component is about 0.6 mm in length, about 0.5 mm in width and about 0.5 mm in thickness.

9. The ceramic multilayer component according to claim 1, wherein the ceramic multilayer body is composed of a BaO—$Al_2O_3$—$SiO_2$-based low-temperature-sintered ceramic material.

10. The ceramic multilayer component according to claim 1, wherein the terminal electrode includes a plurality of terminal electrodes, the plurality of terminal electrodes are located at or adjacent to four corners of the ceramic multilayer body.

11. The ceramic multilayer component according to claim 10, wherein each of the plurality of terminal electrodes has a pentagonal or substantially pentagonal shape.

12. The ceramic multilayer component according to claim 1, wherein the insulating portion is rectangular or substantially rectangular.

13. The ceramic multilayer component according to claim 1, wherein the insulating portion is made of a ceramic-based material.

14. The ceramic multilayer component according to claim 1, wherein the insulating portion is made of a same material as the ceramic multilayer body.

15. The ceramic multilayer component according to claim 1, wherein the ceramic multilayer component is a module component.

16. The ceramic multilayer component according to claim 1, further comprising at least one of a semiconductor element and a resistance element mounted on the ceramic multilayer body.

* * * * *